United States Patent
Wang et al.

(10) Patent No.: US 12,249,999 B2
(45) Date of Patent: Mar. 11, 2025

(54) DUAL GAIN COLUMN STRUCTURE FOR COLUMN POWER AREA EFFICIENCY

(71) Applicant: OMNIVISION TECHNOLOGIES, INC., Santa Clara, CA (US)

(72) Inventors: Rui Wang, San Jose, CA (US); Hiroaki Ebihara, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 230 days.

(21) Appl. No.: 18/171,211

(22) Filed: Feb. 17, 2023

(65) Prior Publication Data

US 2024/0283460 A1  Aug. 22, 2024

(51) Int. Cl.
| | |
|---|---|
| H03M 1/00 | (2006.01) |
| H03M 1/18 | (2006.01) |
| H03M 1/36 | (2006.01) |
| H04N 25/77 | (2023.01) |
| H04N 25/78 | (2023.01) |

(52) U.S. Cl.
CPC ............ *H03M 1/002* (2013.01); *H03M 1/18* (2013.01); *H03M 1/36* (2013.01); *H04N 25/77* (2023.01); *H04N 25/78* (2023.01)

(58) Field of Classification Search
CPC .......... H03M 1/002; H03M 1/18; H03M 1/36; H03M 1/121; H03M 1/56; H04N 25/77; H04N 25/78
See application file for complete search history.

(56) References Cited

U.S. PATENT DOCUMENTS

| | | |
|---|---|---|
| 8,686,339 B2 | 4/2014 | Mabuchi |
| 9,055,250 B2 | 6/2015 | Park et al. |
| 9,774,811 B1 | 9/2017 | Ebihara et al. |
| 10,356,351 B1 | 7/2019 | Ebihara et al. |
| 11,290,674 B1 | 3/2022 | Ebihara |
| 11,343,449 B2 | 5/2022 | Paik et al. |
| 11,418,734 B1 | 8/2022 | Wang et al. |
| 11,445,141 B2 | 9/2022 | Lee et al. |
| 11,503,229 B2 | 11/2022 | Jung et al. |
| 11,528,439 B2 | 12/2022 | Kim et al. |
| 11,671,728 B2 | 6/2023 | Hanzawa |
| 11,716,549 B2 | 8/2023 | Jung et al. |
| 11,765,481 B2 | 9/2023 | Matsuura |
| 11,770,641 B2 | 9/2023 | Tatsuzawa |

(Continued)

OTHER PUBLICATIONS

United States Patent & Trademark Office, Notice of Allowance for U.S. Appl. No. 18/171,227, mailed on Aug. 2, 2024, 18 pages.

*Primary Examiner* — Gevell V Selby
(74) *Attorney, Agent, or Firm* — Perkins Coie LLP

(57) ABSTRACT

A pixel cell readout circuit comprises a ramp generator having a ramp generator output. A first gain network is coupled to the ramp generator output and configured to provide a first variable comparator gain. A second gain network is coupled to the ramp generator output and configured to provide a second variable comparator gain. A first comparator has a first input coupled to the first gain network. The first comparator further has a second input selectively coupled to a first bitline and selectively coupled to a second bitline. A second comparator has a first input coupled to the second gain network. The second comparator further has a second input selectively coupled to the first bitline and selectively coupled to the second bitline.

23 Claims, 12 Drawing Sheets

(56) References Cited

U.S. PATENT DOCUMENTS

| | | |
|---|---|---|
| 12,114,092 B2 | 10/2024 | Wang et al. |
| 2014/0266309 A1 | 9/2014 | Jakobson |
| 2015/0237274 A1 | 8/2015 | Yang et al. |
| 2017/0099423 A1 | 4/2017 | Cremers et al. |
| 2019/0246057 A1 | 8/2019 | Ebihara et al. |
| 2021/0185250 A1* | 6/2021 | Moue ............... H04N 25/75 |
| 2021/0250530 A1 | 8/2021 | Paik et al. |
| 2021/0274121 A1 | 9/2021 | Kim et al. |
| 2022/0060647 A1* | 2/2022 | Lee ............... H04N 25/59 |
| 2022/0078362 A1 | 3/2022 | Jung et al. |
| 2022/0174231 A1 | 6/2022 | Akebono et al. |
| 2022/0368849 A1* | 11/2022 | Hanzawa ............... H04N 25/79 |
| 2022/0394203 A1 | 12/2022 | Matsuura |
| 2022/0417464 A1 | 12/2022 | Tatsuzawa |

\* cited by examiner

|  | T1 | T2 | T3 | T4 |
|---|---|---|---|---|
| CG | HCG | HCG | HCG | HCG |
| gainA | 16 | 4 | 2 | 1 |
| Exposure | 64 | 64 | 8 | 1 |
| Ratio to neighbor | 4 | 16 | 16 | 1 |

*FIG. 3B*

|  | T1 | T2 | T3 | T4 |
|---|---|---|---|---|
| CG | LCG | LCG | LCG | LCG |
| gainA | 16 | 4 | 2 | 1 |
| Exposure | 64 | 64 | 8 | 1 |
| Ratio to neighbor | 4 | 16 | 16 | 1 |

*FIG. 3C*

T1 (Long / 2 x 1-half row)

US 12,249,999 B2

DUAL GAIN COLUMN STRUCTURE FOR COLUMN POWER AREA EFFICIENCY

TECHNICAL FIELD

This disclosure relates generally to image sensors, and in particular but not exclusively, relates to high dynamic range (HDR) complementary metal oxide semiconductor (CMOS) image sensors.

BACKGROUND

Image sensors have become ubiquitous and are now widely used in digital cameras, cellular phones, security cameras, as well as in medical, automotive, and other applications. As image sensors are integrated into a broader range of electronic devices, it is desirable to enhance their functionality, performance metrics, and the like in as many ways as possible (e.g., resolution, power consumption, dynamic range) through both device architecture design as well as image acquisition processing. The technology used to manufacture image sensors has continued to advance at a great pace. For example, the demands of higher resolution and lower power consumption have encouraged the further miniaturization and integration of these devices.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (e.g., image data) representing the external scene. The analog image signals on the bitlines are coupled to readout circuits, which include input stages having analog-to-digital (ADC) circuits to convert those analog image signals from the pixel array into the digital image signals.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

FIGS. 3A, 3B, and 3C illustrate timing of two comparators in an example readout circuit coupled to pixels in dual conversion gain mode, high conversion gain mode, and low conversion gain mode, respectively, in accordance with the teachings of the present disclosure.

Figure 1:
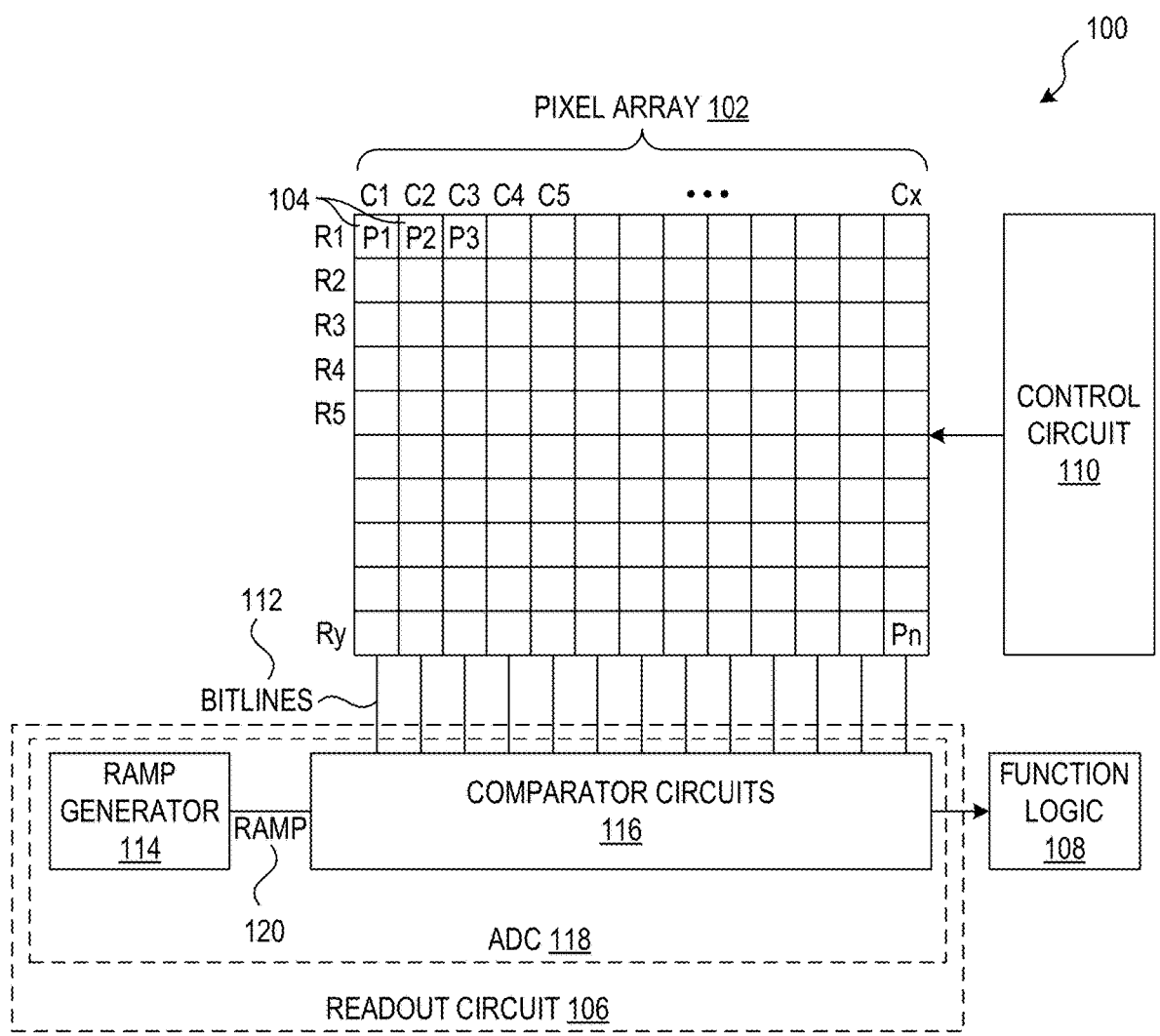
FIG. 1 illustrates one example of an imaging system including a pixel array in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. In addition, common but well-understood elements that are useful or necessary in a commercially feasible embodiment are often not depicted in order to facilitate a less obstructed view of these various embodiments of the present disclosure.

DETAILED DESCRIPTION

Examples directed to an imaging system with a pixel cell readout circuit providing dual-analog-gain are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present disclosure. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with a readout circuit providing dual-analog-gain are disclosed. In various examples, each of a pair of ADC comparators is configured to be selectively coupled to one of two bitlines on a first input and is coupled to a ramp gain network on a second input. In various examples, switch controls are used to achieve bitline selection logic.

Image sensors may implement dual conversion gain to obtain high dynamic range. The high dynamic range may be obtained by reading from pixels under low gain, then high gain, and then combining the two readouts. However, dual conversion gain operation often requires two structures, such as two comparators and/or two ramp gain capacitor networks, for each bitline. This can result in an undesirably large column area.

In various examples of the present disclosure, each pair of bitlines is selectively coupled to a pair of ADC comparators, and the same comparators are used for dual-analog-gain readout and for non-dual conversion gain readout.

To illustrate, FIG. 1 shows one example of an imaging system 100 having a readout circuit 106 providing dual-analog-gain (DAG) in accordance with the teachings of the present disclosure. In particular, the example depicted in FIG. 1 illustrates an imaging system 100 that includes a pixel array 102, bitlines 112, a control circuit 110, a readout circuit 106, and function logic 108. In one example, pixel array 102 is a two-dimensional (2D) array including a plurality of pixel circuits 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

In various examples, the readout circuit 106 may be configured to read out the image signals through the column bitlines 112. As will be discussed, in the various examples, readout circuit 106 may include an analog-to-digital converter (ADC) with DAG in accordance with the teachings of the present disclosure. In various examples, the ADC includes a ramp generator 114 and comparator circuits 116. The ramp generator 114 has a ramp generator output from which a ramp signal 120 is provided to the comparator circuits 116. In the example, the digital image data values generated by the comparator circuits 116 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuit 110 is coupled to pixel array 102 to control operation of the plurality of photodiodes in pixel array 102. For example, control circuit 110 may generate a rolling shutter or a shutter signal for controlling image acquisition. In other examples, image acquisition is synchronized with lighting effects such as a flash.

In one example, imaging system 100 may be included in a digital, cell phone, laptop computer, an endoscope, a security camera, or an imaging device for automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
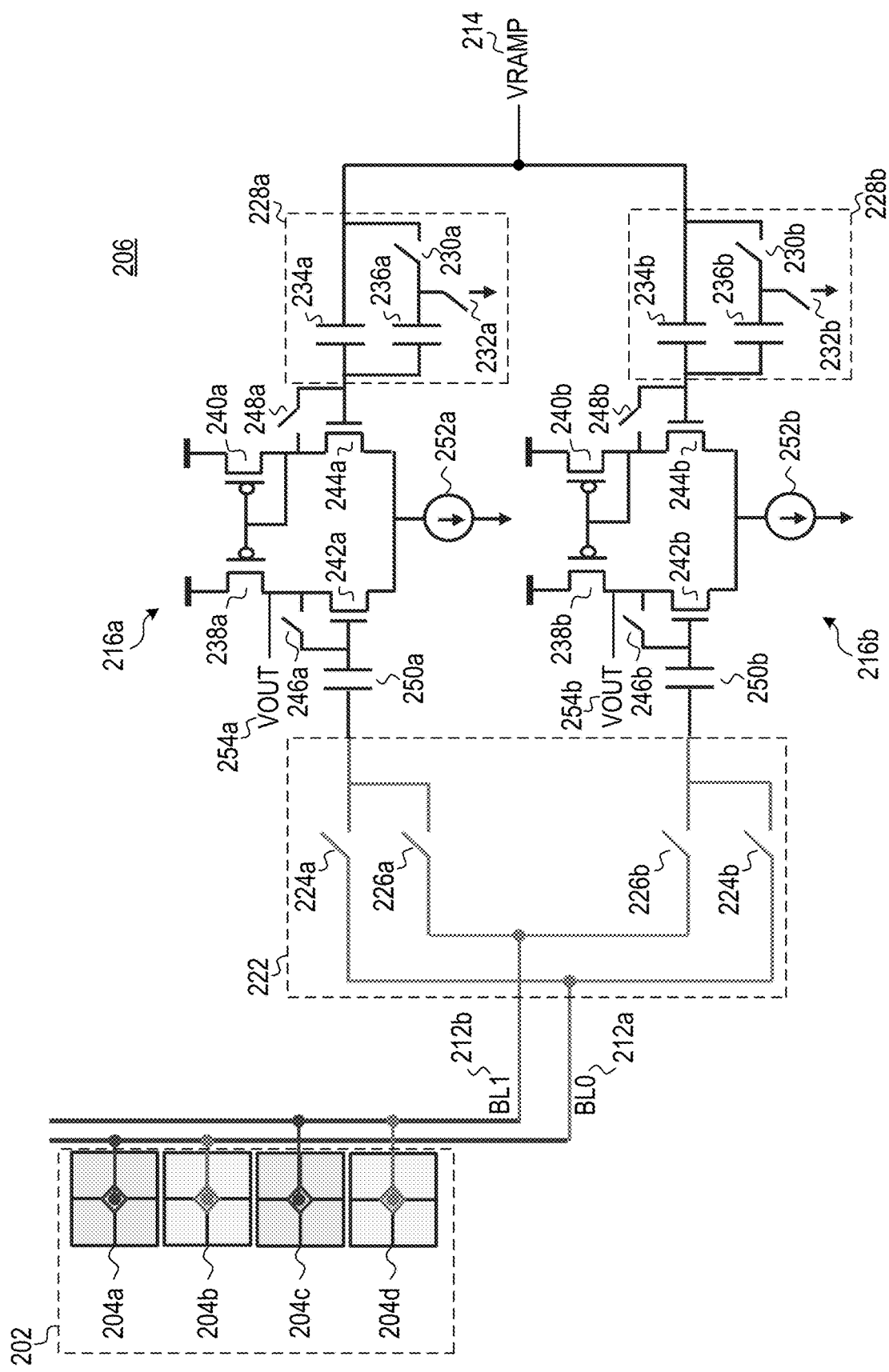
FIG. 2 illustrates a schematic of one example of a readout circuit including two comparators in accordance with the teachings of the present disclosure.

FIG. 2 illustrates a schematic of one example of a readout circuit 206 in accordance with the teachings of the present disclosure. It is appreciated that the readout circuit 206 of FIG. 2 may be an example of the readout circuit 106 included in the imaging system 100 as shown in FIG. 1, and that similarly named and numbered elements described above are coupled and function similarly below.

The readout circuit 206 includes a first comparator 216a with a first input coupled to a bitline switch network 222 and a second input coupled to a first ramp gain network 228a. In the depicted example, it is appreciated that the first input of first comparator 216a is the gate of transistor 242a and the second input of first comparator 216a is the gate of transistor 244a. The readout circuit 206 also includes a second comparator 216b with a first input coupled to the bitline switch network 222 and a second input coupled to a second ramp gain network 228b. In the depicted example, it is appreciated that the first input of second comparator 216b is the gate of transistor 242B and the second input of second comparator 216b is the gate of transistor 244b. As can be appreciated in the depicted example, first comparator 216a shares many similarities with second comparator 216b. Accordingly, for the sake of brevity, the description below may apply to both first comparator 216a and second comparator 216b where applicable. As shown, each of the comparators 216 includes transistors 238 and 240 coupled as a current mirror. A first input transistor 242 is coupled to transistor 238, and a second input transistor 244 is coupled to transistor 240. A tail current source 252 is coupled to transistors 242 and 244 as shown. In the example, a gate node of transistor 242 is coupled to the bitline switch network 222 through capacitor 250, which is coupled to a comparator output VOUT 254 via switch 246. In the example, a gate node of transistor 244 is coupled to the ramp gain network 228. The ramp gain network 228 is also coupled to the transistor 240 via switch 248.

In the illustrated example, the bitline switch network 222 includes a first switch 224a configured to selectively couple and decouple the first comparator 216a to and from a first bitline BL0 212a, a second switch 226a configured to selectively couple and decouple the first comparator 216a to and from a second bitline BL1 212b, a third switch 224b configured to selectively couple and decouple the second comparator 216b to and from the first bitline BL0 212a, and a fourth switch 226b configured to selectively couple and decouple the second comparator 216b to and from the second bitline BL1 212b. In various examples, the bitline switch network 222 includes two switches, each configured to selectively couple one of the comparators 216 to both the first and second bitlines BL0 212a and BL1 212b. In the depicted example, first bitline BL0 212a is coupled to first and second pixel circuits 204a and 204b, and the second bitline BL1 212b is coupled to third and fourth pixel circuits 204c and 204d. The pixel circuits 204 are part of a pixel array 202, which may be an example or an example portion of the pixel array 102 as shown in FIG. 1.

The first and second ramp gain networks 228a and 228b are configured to provide variable comparator gains by controlling the slope of a ramp signal generated by a ramp generator output VRAMP 214 in accordance with the teachings of the present disclosure. The variable comparator gain becomes higher as the slope of the ramp signal becomes lower. As can be appreciated in the depicted example, first ramp gain network 228a shares many similarities with second ramp gain network 228b. Accordingly, for the sake of brevity, the description below may apply to both first ramp gain network 228a and second ramp gain network 228b where applicable. As shown, in the illustrated example, each of the first and second ramp gain networks 228a and 228b includes a first gain capacitor 234 and a second gain capacitor 236. The first gain capacitor 234 may be coupled between the second input of the comparator 216 and the ramp generator output VRAMP 214. The second gain capacitor 236 may be selectively coupled between the second input of the comparator 216 and either the ramp generator output VRAMP 214 via switch 230 or ground via switch 232. Only one of switches 230 and 232 is on at a time, allowing the first and second gain capacitors 234 and 236 to act as a voltage divider when needed to reduce the slope of the ramp signal. In various examples, it is appreciated that other examples of the first and second ramp gain networks 228a and 228b may have different components and/or configurations that provide variable comparator gain in accordance with the teachings of the present disclosure. For example, the number of gain capacitors in each of the first and second ramp gain networks 228a and 228b may depend on the number of desired comparator gain settings. For instance, in various examples, first and second ramp gain networks 228a and 228b may each include one gain capacitor 234 and one or more second gain capacitors 236 with one or more corresponding sets of switches 230 and 232 that selectively couple the respective second gain capacitor 236 between the second input of the comparator 216 and either the ramp generator output VRAMP 214 via switch 230 or ground via switch 232 as shown in the example depicted in FIG. 2.

Figure 3A:
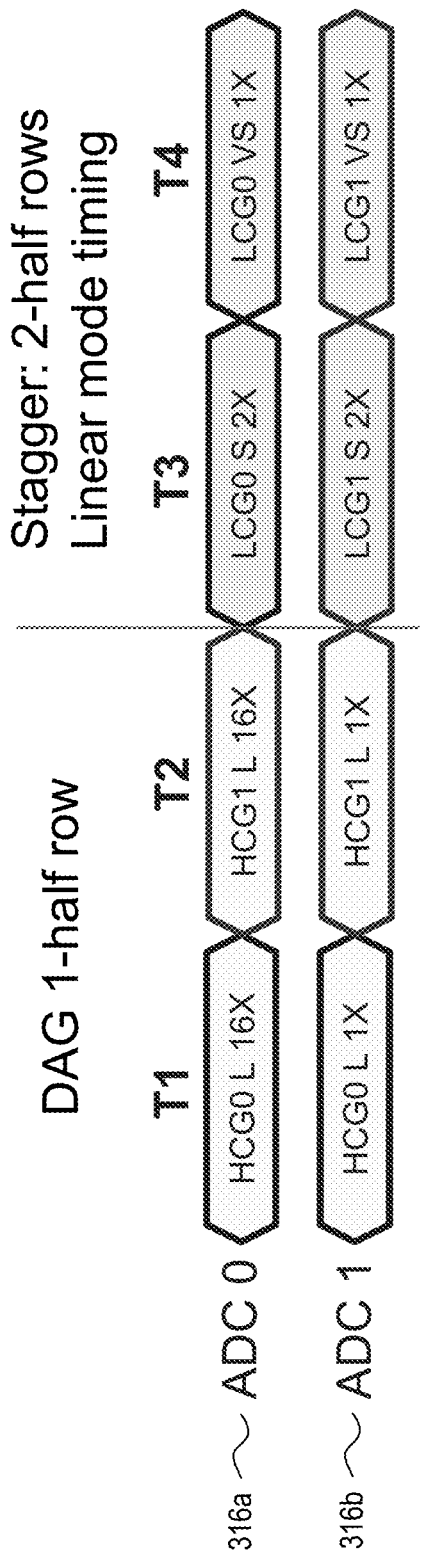
Figure 4A:
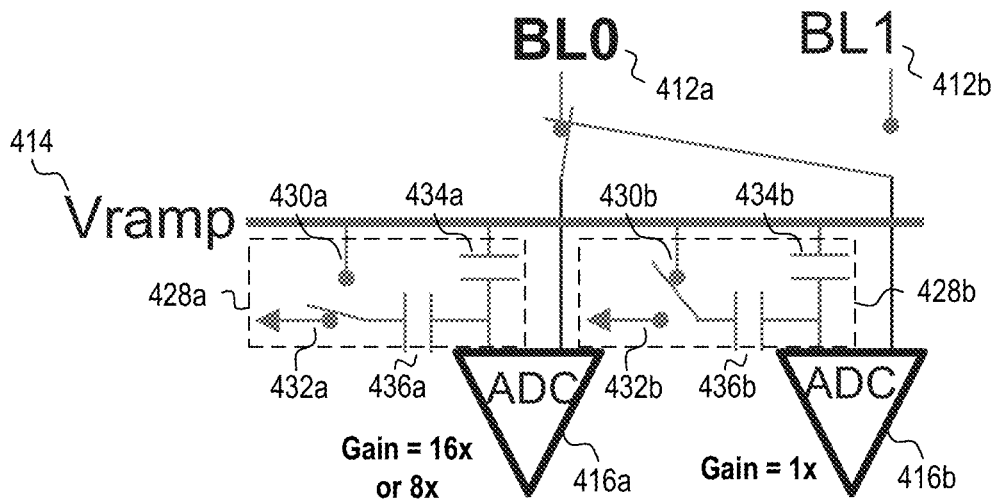
FIGS. 4A, 4B, 4C, and 4D illustrate schematics of one example of a readout circuit including two comparators during two dual-analog-gain readout periods and two linear mode readout periods in accordance with the teachings of the present disclosure.
Figure 4B:
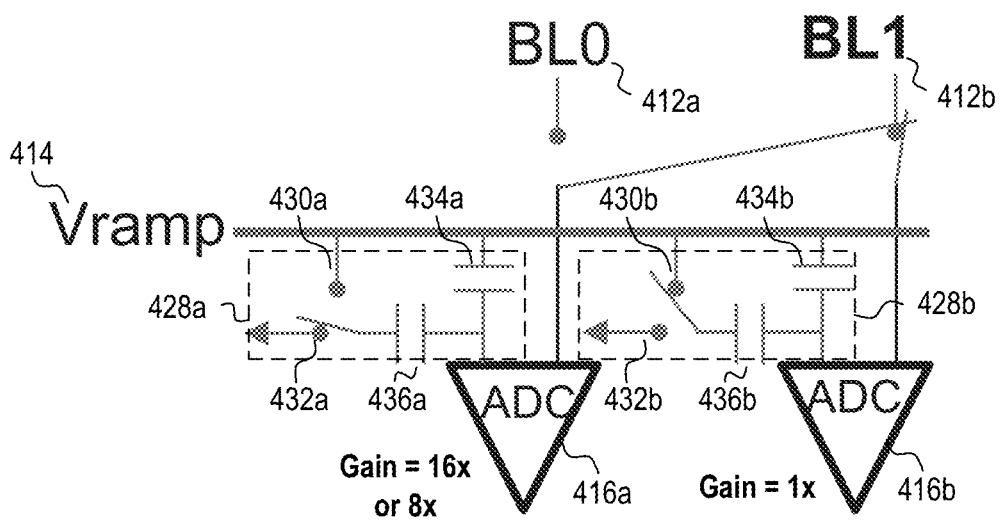
Figure 4C:
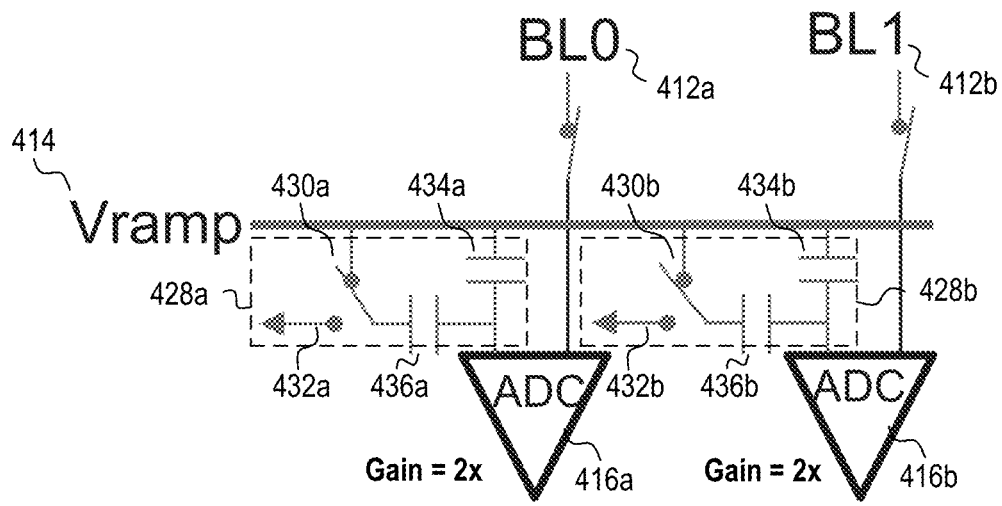
Figure 4D:
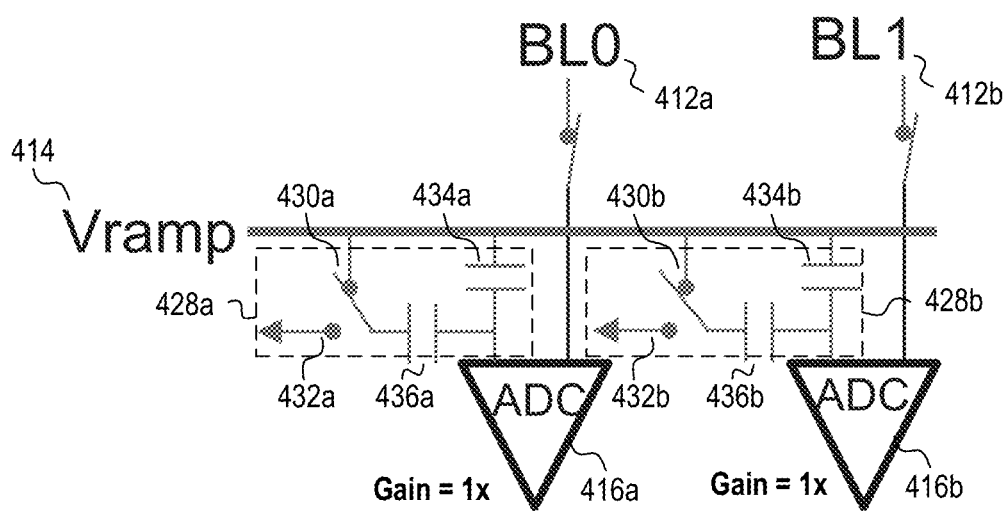

FIG. 3A illustrates a timing diagram of two ADC comparators 316a and 316b in an example readout circuit during a first dual-analog-gain (DAG) long readout period T1, a second DAG long readout period T2, a first linear single analog gain mode short readout period T3, and a second linear single analog gain mode very short readout period T4 in accordance with the teachings of the present disclosure. FIGS. 4A, 4B, 4C, and 4D illustrate schematics of one example of a readout circuit including first and second comparators 416a and 416b during the four readout periods T1, T2, T3, and T4 in accordance with the teachings of the present disclosure. It is appreciated that the first and second comparators 416a and 416b and first and second ramp gain networks 428a and 428b depicted in FIGS. 4A, 4B, 4C, and 4D may be examples of the first and second comparators 216a and 216b and first and second ramp gain networks 228a and 228b depicted in FIG. 2, and that similarly named and numbered elements described above are coupled and function similarly below. The first and second readout periods T1 and T2 correspond to DAG readout, during which time one half-row of pixel circuits is readout through one bitline at a time by the pair of comparators simultaneously. In various examples, if pixels operating in dual conversion gain (DCG) mode are used, the readout circuit is configured to operate in a high conversion gain (HCG) mode during the first and second readout periods T1 and T2, and in a low conversion gain (LCG) mode during the third and fourth readout periods T3 and T4. In the depicted example, the third and fourth readout periods T3 and T4 correspond to staggered linear mode readout, during which time two half-rows of pixel circuits are readout through two bitlines by the pair of comparators simultaneously.

FIGS. 3B and 3C illustrate examples of timing of comparators in an example readout circuit coupled to pixels operating in single conversion gain mode (HCG mode or LCG mode, respectively) during the four readout periods T1, T2, T3, and T4. While pixels operating in single conversion gain mode are more feasible for small pitch pixels, they generally have lower dynamic ranges. For example, while DCG pixels may generate images with a dynamic range of about 120 dB, HCG-only pixels may generate images with a dynamic range of about 108 dB and LCG-only pixels may generate images with a dynamic range of about 111 dB. LCG-only pixels have a slightly higher dynamic range than HCG-only pixels because their readout-noise ratio is less than their conversion gain ratio.

Discussing FIGS. 3A-C and 4A-D together, the first comparator 416a has a first input selectively coupled to either a first bitline BL0 412a or a second bitline BL1 412b depending on the switch configuration (e.g., 222), and a second input coupled to a first ramp gain network 428a. The second comparator 416b has a first input selectively coupled to either the first bitline BL0 412a or the second bitline BL1 412b depending on the switch configuration (e.g., 222), and a second input coupled to a second ramp gain network 428b. In the illustrated example, each ramp gain network 428 includes a first gain capacitor 434 and a second gain capacitor 436. The first gain capacitor 434 may be coupled between the second input of the comparator 416 and a ramp generator output VRAMP 414. The second gain capacitor 436 may be selectively coupled between the second input of the comparator 416 and either the ramp generator output VRAMP 414 via switch 430 or ground via switch 432. Only one of switches 430 and 432 is on at a time, allowing the first and second gain capacitors 434 and 436 to act as a voltage divider when needed to reduce the slope of the ramp signal.

In the depicted example, during the first DAG long readout period T1, the second gain capacitor 436a of the first ramp gain network 428a is coupled to ground via switch 432a. The first ramp gain network 428a can be configured to provide the first comparator 416a a comparator gain of 16× or 8×. The second gain capacitor 436b of the second ramp gain network 428b is coupled to the ramp generator output VRAMP 414 via switch 430b. The second ramp gain network 428b can be configured to provide the first comparator 416a a comparator gain of 1×. In various examples, both the first and second comparators 416a and 416b are selectively coupled to the first bitline BL0 412a and selectively decoupled from the second bitline BL1 412b such that a DAG readout of the first bitline can be performed.

In the depicted example, during the second DAG long readout period T2, the first and second ramp gain networks 428a and 428b may remain in the same configuration as in the first DAG long readout period T1. The first ramp gain network 428a may continue to provide a comparator gain of 16× or 8×, while the second ramp gain network 428b may continue to provide a comparator gain of 1×. In other words, in the depicted examples, the first ramp gain network 428a is configured to provide a comparator gain (e.g., 16× or 8×) that is greater than the comparator gain (e.g., 1×) that is configured to be provided by the second ramp gain network 428b during the first and second DAG long readout periods T1 and T2. In various examples, both the first and second comparators 416a and 416b are selectively coupled to the second bitline BL1 412b and selectively decoupled from the first bitline BL0 412a such that a DAG readout of the second bitline can be performed.

In various examples, it is appreciated that during the first and second DAG long readout periods T1 and T2, the decoupled (i.e., non-selected, floating) bitline (e.g., the second bitline BL1 412b for the first readout period T1, the first bitline BL0 412a for the second readout period T2) may be configured to reduce horizontal fixed-pattern noise associated with the bitline. One example of such a configuration is clamping the bitline.

In the depicted example, during the first linear mode short readout period T3, the second gain capacitor 436a of the first ramp gain network 428a is coupled to the ramp generator output VRAMP 414 via switch 430a. The second gain capacitor 436b of the second ramp gain network 428b may remain coupled to the ramp generator output VRAMP 414 via switch 430b. Both the first and second ramp gain networks 428a and 428b can be configured to provide equal comparator gains of 2× each. The first comparator 416a is now coupled to the first bitline BL0 412a, while the second comparator 416b is now coupled to the second bitline BL1 412b such that linear mode readouts of both the first and second bitlines 412a and 412b can be performed through respective first and second comparators 416a and 416b.

During the second linear mode very short readout period T4, the switches remain in the same configuration as in the first linear mode short readout period T3. However, both the first and second ramp gain networks 428a and 428b can now be configured to provide equal comparator gains of 1× each. In other words, the first and second variable comparator gains (e.g., 2×) during the third readout period T3 are configured to be greater than the first and second variable comparator gains (e.g., 1×) during the fourth readout period T4. Linear mode readouts of both the first and second bitlines are then performed.

In various examples, it is appreciated that the first and second ramp gain networks 428a and 428b can provide any variable comparator gain (e.g., 1×, 2×, 4×, 8×, 16×, etc.) to the first and second comparators 416a and 416b. For example, during the first readout period T1, the variable comparator gain provided to the first comparator 416a can be configured to be greater than the variable comparator gain provided to the second comparator 416b. It is appreciated that the same comparators 416a and 416b are used to perform both DAG and linear mode readouts, which allows a reduction in the number of components and the column area needed.

Figure 5:
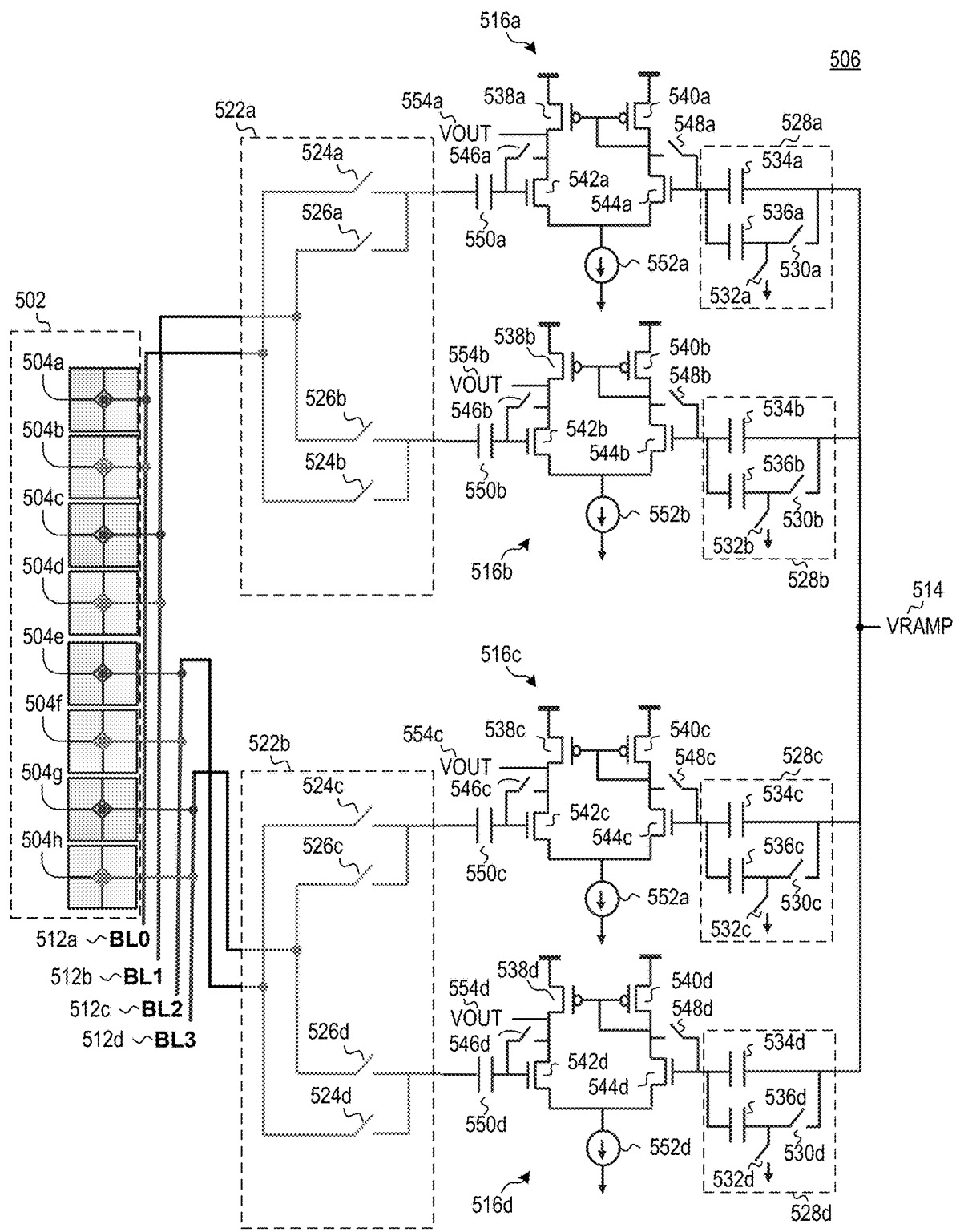
FIG. 5 illustrates a schematic of another example of a readout circuit including four comparators in accordance with the teachings of the present disclosure.

FIG. 5 illustrates a schematic of another example of a readout circuit 506 in accordance with the teachings of the present disclosure. It is appreciated that the readout circuit 506 of FIG. 5 may be an example of the readout circuit 106 included in the imaging system 100 as shown in FIG. 1, and that similarly named and numbered elements described above are coupled and function similarly below.

The readout circuit 506 includes a first comparator 516a with a first input coupled to a first bitline switch network 522a and a second input coupled to a first ramp gain network 528a, and a second comparator 516b with a first input coupled to the first bitline switch network 522a and a second input coupled to a second ramp gain network 528b. The readout circuit 506 further includes a third comparator 516c with a first input coupled to a second bitline switch network 522b and a second input coupled to a third ramp gain network 528c, and a fourth comparator 516d with a first input coupled to the second bitline switch network 522b and a second input coupled to a fourth ramp gain network 528d.

The details regarding each of the capacitors 516, the first bitline switch network 522a, and the ramp gain networks 528 are generally similar to the capacitors 216, the bitline switch network 222, and ramp gain networks 228 shown in and discussed with respect to FIG. 2, and so are omitted.

The second bitline switch network 522b includes a first switch 524c configured to selectively couple and decouple the third comparator 516c to and from a third bitline BL2 512c, a second switch 526C configured to selectively couple and decouple the third comparator 516c to and from a fourth bitline BL3 512d, a third switch 524d configured to selectively couple and decouple the fourth comparator 516d to and from the third bitline BL2 512c, and a fourth switch 526D configured to selectively couple and decouple the fourth comparator 516d to and from the fourth bitline BL3 512d.

The first bitline BL0 512a is coupled to first and second pixel circuits 504a and 504b, the second bitline BL1 512b is coupled to third and fourth pixel circuits 504c and 504d, the third bitline BL2 512c is coupled to fifth and sixth pixel circuits 504e and 504f, and the fourth bitline BL3 512d is coupled to seventh and eighth pixel circuits 504g and 504h. The pixel circuits 504 are part of a pixel array 502, which may be an example or an example portion of the pixel array 102 as shown in FIG. 1.

As will be discussed below, this four-bitline configuration allows the readout circuit 506 to readout twice as many pixel circuits 504 as the readout circuit 206 illustrated in FIG. 2 can readout in the same amount of time. However, this advantage should be balanced against the need for more circuitry components and column area.

Figure 6:
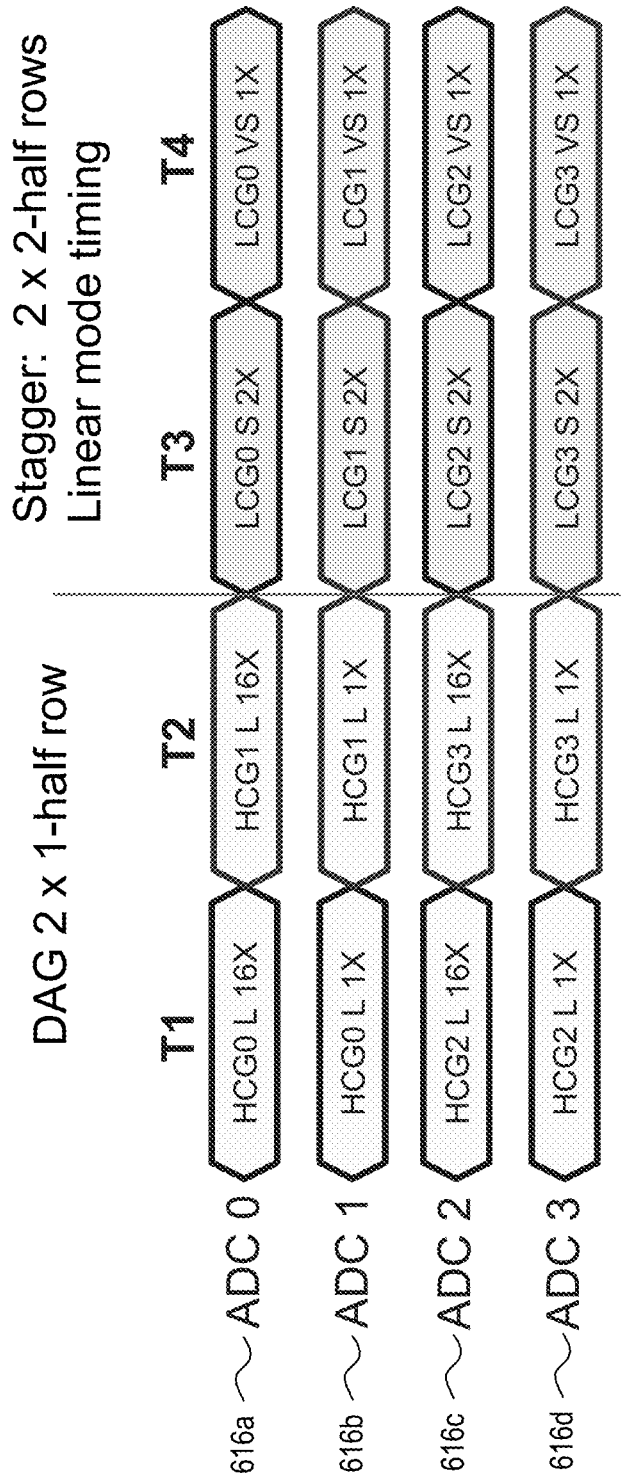
FIG. 6 illustrates a timing diagram of four comparators in an example readout circuit during two dual-analog-gain readout periods and two linear mode readout periods in accordance with the teachings of the present disclosure.
Figure 7A:
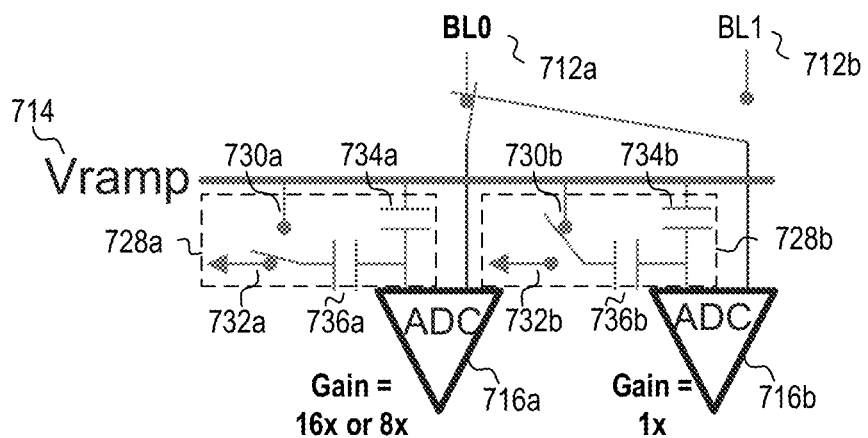
FIGS. 7A, 7B, 7C, and 7D illustrate schematics of one example of a readout circuit including four comparators during two dual-analog-gain readout periods and two linear mode readout periods in accordance with the teachings of the present disclosure.
Figure 7A:
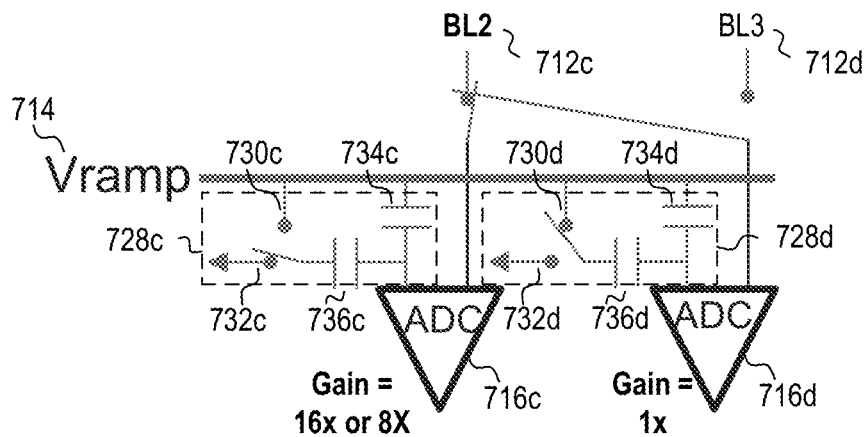
Figure 7B:
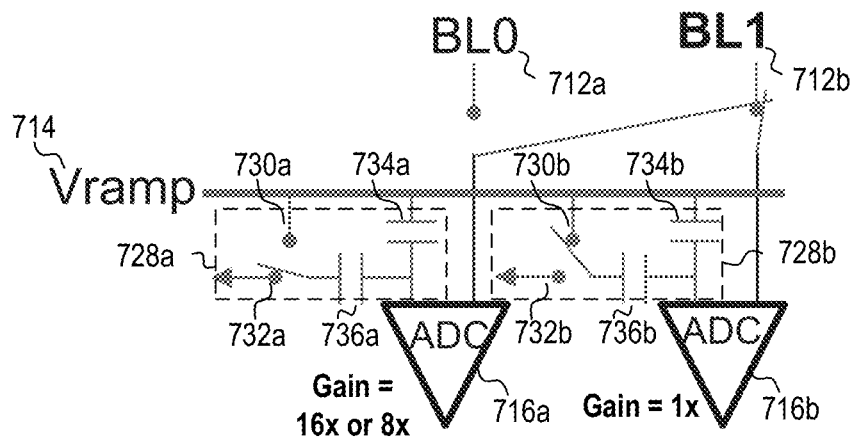
Figure 7B:
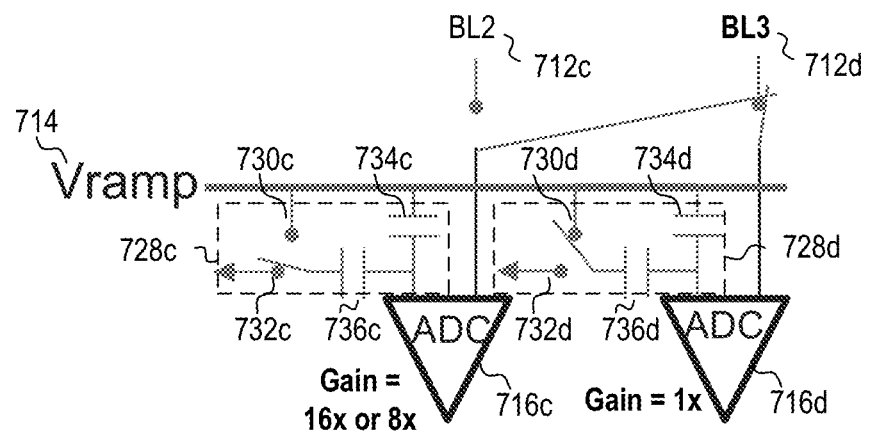
Figure 7C:
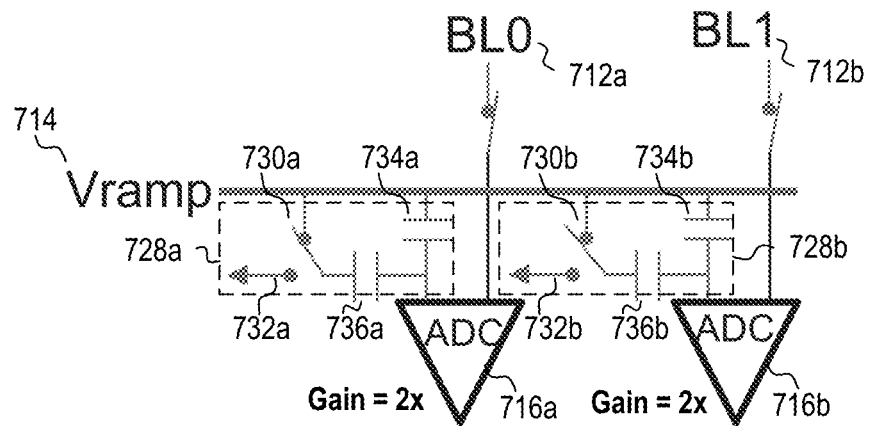
Figure 7C:
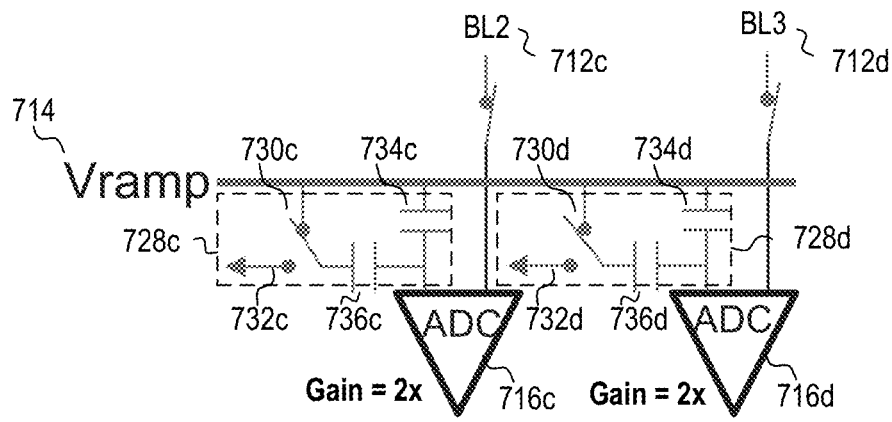
Figure 7D:
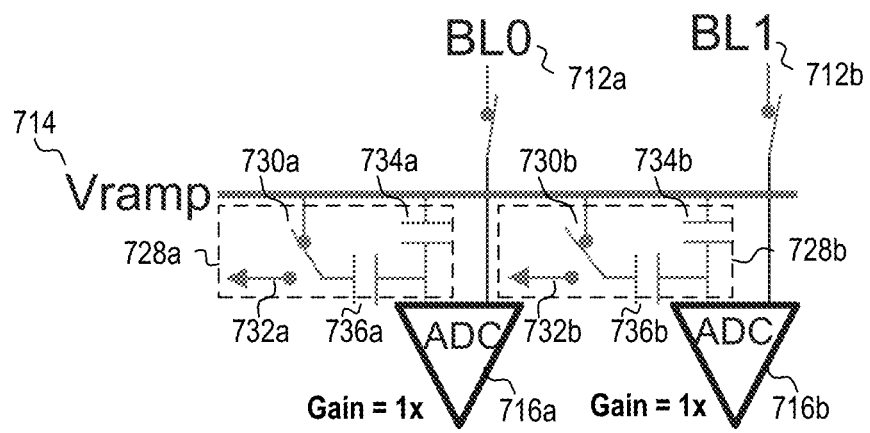
Figure 7D:
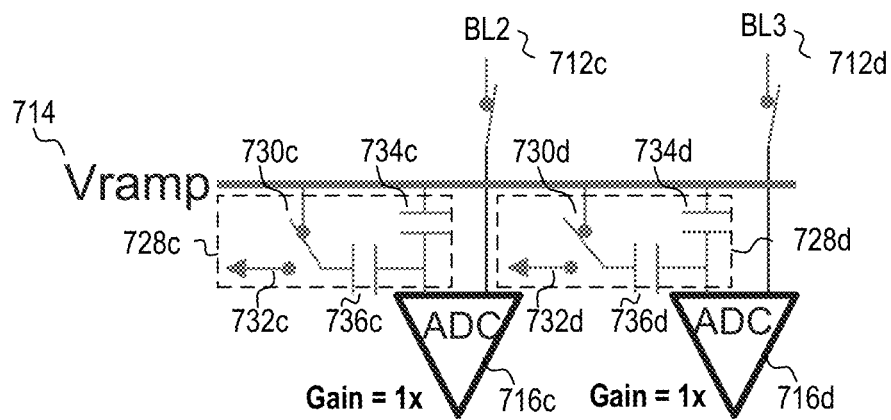

FIG. 6 illustrates a timing diagram of four ADC comparators 616a, 616b, 616c, and 616d in an example readout circuit during a first dual-analog-gain (DAG) long readout period T1, a second DAG long readout period T2, a first linear mode short readout period T3, and a second linear mode very short readout period T4 in accordance with the teachings of the present disclosure. FIGS. 7A, 7B, 7C, and 7D illustrate schematics of one example of a readout circuit including four comparators 716a, 716b, 716c, and 716d during the four readout periods T1, T2, T3, and T4 in accordance with the teachings of the present disclosure. The first and second readout periods T1 and T2 correspond to DAG readout, during which time two one-half rows of pixel circuits is readout by the four comparators at a time. In various examples, if pixels operating in dual conversion gain (DCG) mode are used, the readout circuit is configured to operate in a high conversion gain (HCG) mode during the first and second readout periods T1 and T2, and in a low conversion gain (LCG) mode during the third and fourth readout periods T3 and T4. In the depicted example, the third and fourth readout periods T3 and T4 correspond to staggered linear mode readout, during which time two two-half rows of pixel circuits are readout by the four comparators at a time.

As discussed above, FIGS. 3B and 3C illustrate examples of timing of comparators in an example readout circuit (e.g., with four comparators) coupled to pixels operating in single conversion gain mode (HCG mode or LCG mode, respectively) during the four readout periods T1, T2, T3, and T4.

Discussing FIGS. 6, and 7A-D together, the details regarding the portions of the timing diagram and the schematics illustrating the first and second comparators 716a and 716b couplable to the first and second bitlines BL0 712a and BL1 712b are generally similar to the timing diagram in FIG. 3A and the schematics in FIGS. 4A-D, and so are omitted. The portions of the timing diagram and the schematics illustrating the third and fourth comparators 716c and 716d couplable to the third and fourth bitlines BL2 712c and BL3 712d mirror the portions of the timing diagram and the schematics illustrating the first and second comparators 716a and 716b couplable to the first and second bitlines BL0 712a and BL1 712b during each of the four readout periods T1, T2, T3, and T4.

For example, during the first DAG long readout period T1, the first and third comparators 716a and 716c are provided with a comparator gain of 16× or 8×, and the second and fourth comparators 716b and 716d are provided with a comparator gain of 1×. In various examples, the first and second comparators 716a and 716b are selectively coupled to the first bitline BL0 712a and selectively decoupled from the second bitline BL1 712b, and the third and fourth comparators 716c and 716d are selectively coupled to the third bitline BL2 712c and selectively decoupled from the fourth bitline BL3 712d such that DAG readouts of the first and third bitlines can be performed.

During the second DAG long readout period T2, the comparator gains to the comparators 716a-d may remain the same as in the first DAG long readout period T1. In various examples, the first and second comparators 716a and 716b are selectively coupled to the second bitline BL1 712b and selectively decoupled from the first bitline BL0 712a, and the third and fourth comparators 716c and 716d are selectively coupled to the fourth bitline BL3 712d and selectively decoupled from the third bitline BL2 712c such that DAG readouts of the second and fourth bitlines can be performed.

In various examples, during the first and second DAG long readout periods T1 and T2, the decoupled (i.e., non-selected, floating) bitlines (e.g., the second and fourth bitlines BL1 712b and BL3 712d for the first readout period T1, the first and third bitlines BL0 712a and BL2 712c for the second readout period T2) are adjusted to reduce horizontal fixed-pattern noise associated with the bitlines. One example of such adjustment is clamping the bitlines.

During the first linear mode short readout period T3, all four comparators 716a-d are provided with equal gains of 2× each. The first comparator 716a is coupled to the first bitline BL0 712a, the second comparator 716b is coupled to the second bitline BL1 712b, the third comparator 716c is coupled to the third bitline BL2 712c, and the fourth comparator 716d is coupled to the fourth bitline BL3 712d such that linear mode readouts of all four bitlines can be performed.

During the second linear mode very short readout period T4, the switches remain in the same configuration as in the first linear mode short readout period T3. However, the four comparators are provided with equal gains of 1× each. Linear mode readouts of all four bitlines are performed again.

In various examples, the four ramp gain networks 728a-d can provide any variable comparator gain (e.g., 1×, 2×, 4×, 8×, 16×) to their corresponding comparator 716a-d. For example, during the first readout period T1, the variable comparator gain provided to the first comparator 716a can be configured to be greater than the variable comparator gain provided to the second comparator 716b. It is appreciated that the same comparators 716a-d are used to perform both DAG and linear mode readouts, which allows a reduction in the number of components and the column area needed.

The above description of illustrated examples of the disclosure, including what is described in the Abstract, is not intended to be exhaustive or to limit the disclosure to the precise forms disclosed. While specific examples of the disclosure are described herein for illustrative purposes, various modifications are possible within the scope of the disclosure, as those skilled in the relevant art will recognize.

These modifications can be made to the disclosure in light of the above detailed description. The terms used in the following claims should not be construed to limit the disclosure to the specific examples disclosed in the specification. Rather, the scope of the disclosure is to be determined entirely by the following claims, which are to be construed in accordance with established doctrines of claim interpretation.

What is claimed is:

1. A pixel cell readout circuit, comprising:
    a ramp generator having a ramp generator output;
    a first gain network coupled to the ramp generator output and configured to provide a first variable comparator gain;
    a second gain network coupled to the ramp generator output and configured to provide a second variable comparator gain;
    a first comparator having a first input coupled to the first gain network, the first comparator further having a second input selectively coupled to a first bitline and selectively coupled to a second bitline; and
    a second comparator having a first input coupled to the second gain network, the second comparator further having a second input selectively coupled to the first bitline and selectively coupled to the second bitline,
    wherein during a first readout period, the first variable comparator gain is configured to be different from the second variable comparator gain, and the second inputs of the first and second comparators are selectively coupled to the first bitline and selectively decoupled from the second bitline; and
    wherein during a second readout period, the first variable comparator gain is configured to be different from the second variable comparator gain, and the second inputs of the first and second comparators are selectively coupled to the second bitline and selectively decoupled from the first bitline.

2. The pixel cell readout circuit of claim 1, wherein during the first and second readout periods, the first variable comparator gain is configured to be greater than the second variable comparator gain.

3. The pixel cell readout circuit of claim 1, wherein the first and second bitlines are coupled to pixels operating in dual conversion gain (DCG) mode, and wherein during the first and second readout periods, the pixel cell readout circuit is configured to operate in a high conversion gain (HCG) mode.

4. The pixel cell readout circuit of claim 1, wherein during a third readout period, the first variable comparator gain is configured to be equal to the second variable comparator gain, the second input of the first comparator is selectively coupled to the first bitline, and the second input of the second comparator is selectively coupled to the second bitline.

5. The pixel cell readout circuit of claim 4, wherein during a fourth readout period, the first variable comparator gain is configured to be equal to the second variable comparator gain, the second input of the first comparator is coupled to the first bitline, and the second input of the second comparator is coupled to the second bitline.

6. The pixel cell readout circuit of claim 5, wherein the first and second variable comparator gains during the third readout period are configured to be greater than the first and second variable comparator gains during the fourth readout period.

7. The pixel cell readout circuit of claim 5, wherein the first and second bitlines are coupled to pixels operating in dual conversion gain (DCG) mode, and wherein during the third and fourth readout periods, the pixel cell readout circuit is configured to operate in a low conversion gain (LCG) mode.

8. The pixel cell readout circuit of claim 5, wherein the first and second bitlines are coupled to pixels operating in single conversion gain mode, and wherein during all of the first, second, third, and fourth readout periods, the pixel cell readout circuit is configured to operate in either a high conversion gain (HCG) mode or a low conversion gain (LCG) mode.

9. The pixel cell readout circuit of claim 1, wherein the first gain network comprises:
   a first capacitor coupled between the ramp generator output and the first input of the first comparator; and
   a second capacitor selectively coupled between the first input of the first comparator and either the ramp generator output or ground.

10. The pixel cell readout circuit of claim 1, wherein the second gain network comprises:
    a third capacitor coupled between the ramp generator output and the first input of the second comparator; and
    a fourth capacitor selectively coupled between the first input of the second comparator and either the ramp generator output or ground.

11. The pixel cell readout circuit of claim 1, further comprising:
    a third gain network coupled to the ramp generator output and configured to provide a third variable comparator gain;
    a fourth gain network coupled to the ramp generator output and configured to provide a fourth variable comparator gain;
    a third comparator having a first input coupled to the third gain network, the third comparator further having a second input selectively coupled to a third bitline and selectively coupled to a fourth bitline; and
    a fourth comparator having a first input coupled to the fourth gain network, the fourth comparator further having a second input selectively coupled to the third bitline and selectively coupled to the fourth bitline,
    wherein during the first readout period, the third variable comparator gain is configured to be different from the fourth variable comparator gain, and the second inputs of the third and fourth comparators are selectively coupled to the third bitline and selectively decoupled from the fourth bitline; and
    wherein during the second readout period, the third variable comparator gain is configured to be different from the fourth variable comparator gain, and the second inputs of the third and fourth comparators are selectively coupled to the fourth bitline and selectively decoupled from the third bitline.

12. The pixel cell readout circuit of claim 1, wherein during the first readout period, the second bitline is configured to be clamped to reduce horizontal fixed-pattern noise associated with the second bitline.

13. The pixel cell readout circuit of claim 1, wherein during the second readout period, the first bitline is configured to be clamped to reduce horizontal fixed-pattern noise associated with the first bitline.

14. A method of operating a pixel cell readout circuit, comprising:
    coupling a first gain network between a ramp generator and a first comparator, wherein the first gain network is configured to provide a first variable comparator gain;
    coupling a second gain network between the ramp generator and a second comparator, wherein the second gain network is configured to provide a second variable comparator gain;
    during a first readout period—
        selectively coupling the first and second comparators to a first bitline;
        setting the first and second variable comparator gains to be different values; and
        reading out an image signal from the first bitline; and
    during a second readout period—
        selectively coupling the first and second comparators to a second bitline;
        setting the first and second variable comparator gains to be different values; and
        reading out an image signal from the second bitline.

15. The method of claim 14, further comprising:
    coupling the first and second bitlines to pixels operating in dual conversion gain (DCG) mode; and
    during the first and second readout periods—
        operating the pixel cell readout circuit in a high conversion gain (HCG) mode.

16. The method of claim 14, further comprising:
    during a third readout period—
        selectively coupling the first comparator to the first bitline;
        selectively coupling the second comparator to the second bitline;
        setting the first and second variable comparator gains to be same values; and
        reading out image signals from the first and second bitlines.

17. The method of claim 16, further comprising:
    during a fourth readout period—
        setting the first and second variable comparator gains to be same values; and
        reading out image signals from the first and second bitlines.

18. The method of claim 17, further comprising:
    coupling the first and second bitlines to pixels operating in dual conversion gain (DCG) mode; and
    during the third and fourth readout periods—
        operating the pixel cell readout circuit in a low conversion gain (LCG) mode.

19. The method of claim 17, further comprising:
    coupling the first and second bitlines to pixels operating in single conversion gain mode; and
    during all of the first, second, third, and fourth readout periods—
        operating the pixel cell readout circuit in either a high conversion gain (HCG) mode or a low conversion gain (LCG) mode.

20. The method of claim 14, further comprising:
    during the first and second readout periods—
        setting the first variable comparator gain to 8 or 16; and
        setting the second variable comparator gain to 1.

21. The method of claim 17, further comprising:
    during the third readout period—
        setting the first and second variable comparator gains to 2; and
    during the fourth readout period—
        setting the first and second variable comparator gains to 1.

22. The method of claim 14, further comprising:
coupling a third gain network between the ramp generator and a third comparator, wherein the third gain network is configured to provide a third variable comparator gain;
coupling a fourth gain network between the ramp generator and a fourth comparator, wherein the fourth gain network is configured to provide a fourth variable comparator gain;
during the first readout period—
   selectively coupling the third and fourth comparators to a third bitline;
   setting the third and fourth variable comparator gains to be different values; and
   reading out an image signal from the third bitline; and
during the second readout period—
   selectively coupling the third and fourth comparators to a fourth bitline;
   setting the third and fourth variable comparator gains to be different values; and
   reading out an image signal from the fourth bitline.

23. The method of claim 14, further comprising:
during the first readout period—
   clamping the second bitline to reduce horizontal fixed-pattern noise associated with the second bitline; and
during the second readout period—
   clamping the first bitline to reduce horizontal fixed-pattern noise associated with the first bitline.

* * * * *